(12) United States Patent
Fu

(10) Patent No.: US 11,191,194 B2
(45) Date of Patent: Nov. 30, 2021

(54) DISPLAY DEVICE

(71) Applicant: TCL China Star Optoelectronics Technology Co., Ltd., Shenzhen (CN)

(72) Inventor: Xiaoli Fu, Shenzhen (CN)

(73) Assignee: TCL China Star Optoelectronics Technology Co., Ltd., Shenzhen (CN)

( * ) Notice: Subject to any disclaimer, the term of this patent is extended or adjusted under 35 U.S.C. 154(b) by 212 days.

(21) Appl. No.: 16/625,373

(22) PCT Filed: Dec. 2, 2019

(86) PCT No.: PCT/CN2019/122356
§ 371 (c)(1),
(2) Date: Dec. 20, 2019

(87) PCT Pub. No.: WO2021/097904
PCT Pub. Date: May 27, 2021

(65) Prior Publication Data
US 2021/0337706 A1  Oct. 28, 2021

(30) Foreign Application Priority Data
Nov. 21, 2019  (CN) .......................... 201911151405.4

(51) Int. Cl.
*H05K 7/20* (2006.01)
*H05K 1/14* (2006.01)
*H05K 1/02* (2006.01)

(52) U.S. Cl.
CPC ....... *H05K 7/20963* (2013.01); *H05K 1/0206* (2013.01); *H05K 1/028* (2013.01); *H05K 1/14* (2013.01); *H05K 2201/10128* (2013.01)

(58) Field of Classification Search
CPC ...... H05K 7/20963; H05K 1/14; H05K 1/028; H05K 1/0206; H05K 2201/10128
USPC .......................................... 361/710
See application file for complete search history.

(56) References Cited

U.S. PATENT DOCUMENTS

| | | | |
|---|---|---|---|
| 6,556,268 B1* | 4/2003 | Lee ..................... | G02F 1/13452 349/149 |
| 2014/0056025 A1* | 2/2014 | Kang .................... | G02B 6/009 362/609 |
| 2016/0105949 A1* | 4/2016 | Fu ........................ | H01L 23/36 361/707 |
| 2020/0303276 A1* | 9/2020 | Hwang .............. | H01L 23/3737 |

* cited by examiner

*Primary Examiner* — Sherman Ng
(74) *Attorney, Agent, or Firm* — Luedeka Neely Group, P.C.

(57) ABSTRACT

The disclosure provides a display device, including a display panel, a flexible circuit board (FCB), a printed circuit board (PCB), and a source driver chip. The PCB is connected to the display panel by the FCB, the source driver chip is bonded to a front side of the PCB, and an exposed copper area is disposed on a backside of the PCB corresponding to the source driver chip. Therefore, heat dissipation effect of a chip is improved, production costs are reduced, and working stability of products is ensured.

9 Claims, 4 Drawing Sheets

DISPLAY DEVICE

FIELD

The present disclosure relates to the field of display technology and, more particularly, relates to a display device.

BACKGROUND

With development of display technologies, flat-panel devices have been widely used in mobile phones, televisions, personal digital assistants, digital cameras, laptops, desktops, and so on due to advantages of high image quality, power saving, thin body, and wide applications and have become a mainstream of display devices. Conventional flat-panel devices mainly include liquid crystal display (LCD) devices or organic light-emitting diode (OLED) display devices.

The LCD devices usually include an LCD panel and a backlight module. A working principle of the LCD panel is: a voltage is applied to two glass substrates to control orientations of liquid crystals disposed therebetween, and light emitted from the backlight module is refracted by the liquid crystals to generate images.

As to a working principle of the OLED device: charge carriers are injected to conductive materials and organic light-emitting materials by electric field, and light is generated by recombination of the charge carriers. Specifically, an anode and a cathode of OLED display panels are typically and respectively made of an indium tin oxide (ITO) pixel electrode and a metal electrode. Driven by a certain voltage, electrons and holes are respectively injected from an electron injection layer and a hole injection layer, respectively pass through an electron transport layer and a hole injection layer, and meet in a luminescent layer to form excitons that emit light by radiation.

Either LCD devices and OLED devices need to be driven by external voltage sources. As shown in FIG. 1, conventional display devices include a printed circuit board (PCB) 100, a chip on film (COF) 200, a source driver chip 300 disposed on the COF 200, and a display panel 400. An input and an output of the COF 200 are respectively connected to the PCB 100 and the display panel 400. Temperatures of the source driver chip 300 are usually too high during a working process. To solve the above problem, a heat dissipation attachment is generally added to the COF 300. However, the heat dissipation attachment cannot effectively reduce temperatures of the driver chip 300 because of its limitation of heat dissipation capability; furthermore, production costs may increase because of additional heat dissipation attachments.

SUMMARY

An objective of the present disclosure is to provide a display device which can improve a heat dissipation capability of a chip, reduce production costs, and simplify a manufacturing process.

To achieve the above goal, the present disclosure provides a display device, including a display panel, a flexible circuit board (FCB), a printed circuit board (PCB), and a source driver chip. The PCB is connected to the display panel by the FCB.

The source driver chip is bonded to a front side of the PCB, and an exposed copper area is disposed on a backside of the PCB corresponding to the driver chip.

A horizontal projection of the source driver chip on the PCB is less than an area of the exposed copper area.

An auxiliary heat dissipation layer is disposed on a side of the exposed copper area away from the source driver chip.

A material of the auxiliary heat dissipation layer is graphene.

The auxiliary heat dissipation layer comprises a plurality of heat dissipation strips spaced apart from each other.

The display device comprises at least one thermal conductor, at least one through hole is defined in the PCB, one of the at least one the thermal conductor is disposed in each of the at least one through hole, an end of the at least one thermal conductor is in contact with the exposed copper area, and the other side of the at least one thermal conductor is in contact with the source driver chip.

A material of the thermal conductor is copper.

A material of the thermal conductor is graphene.

The source driver chip comprises at least one dummy pin, and each of the at least one dummy pin is in contact with one of the at least one thermal conductor.

The thermal conductor fully fills the through hole.

Regarding the beneficial effects: the present disclosure provides a display device, including a display panel, an FCB, a PCB, and a source driver chip. The PCB is connected to the display panel by the FCB, the source driver chip is bonded to a front side of the PCB, and an exposed copper area is disposed on a backside of the PCB corresponding to the source driver chip. Therefore, heat dissipation effect of a chip is improved, production costs are reduced, and working stability of products is ensured.

DESCRIPTION OF DRAWINGS

The accompanying figures to be used in the description of embodiments of the present disclosure or prior art will be described below to more clearly illustrate the features and technical solutions of the present disclosure. However, the accompanying figures described below are only for reference and illustration but are not for limiting the present disclosure.

DETAILED DESCRIPTION

In order to further illustrate the technical means and effects used to achieve the intended purpose of the present disclosure, they are described in detail below in conjunction with drawings and preferred embodiments.

Figure 1:
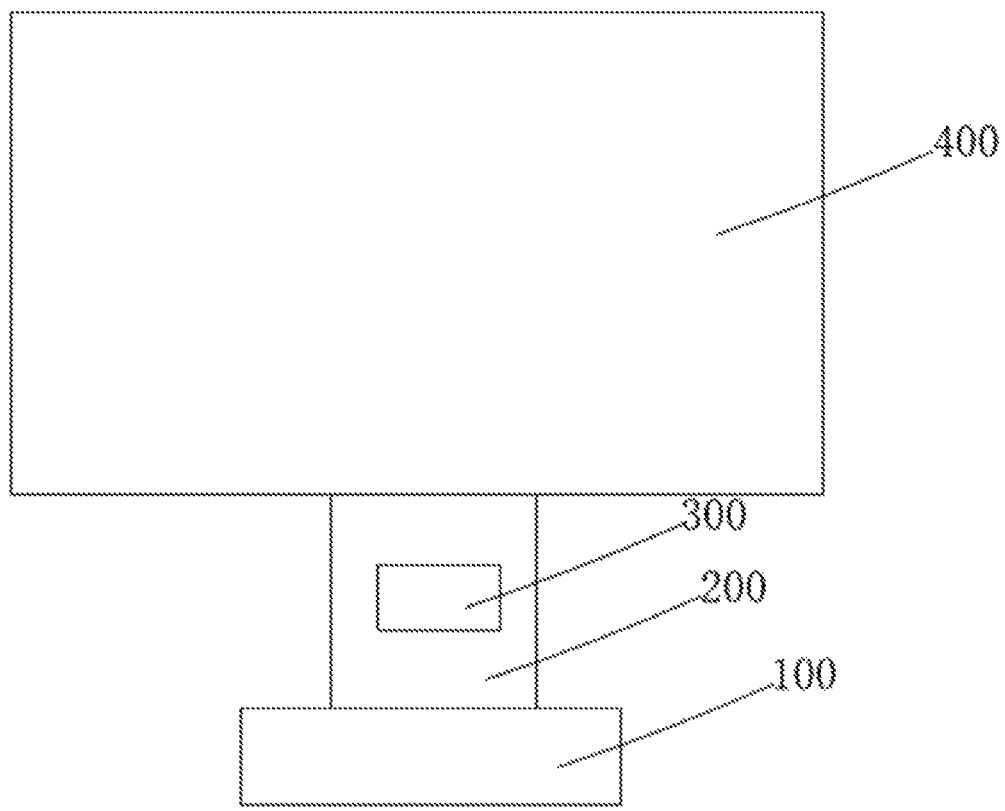
FIG. 1 is a schematic view showing a conventional display device.
Figure 2:
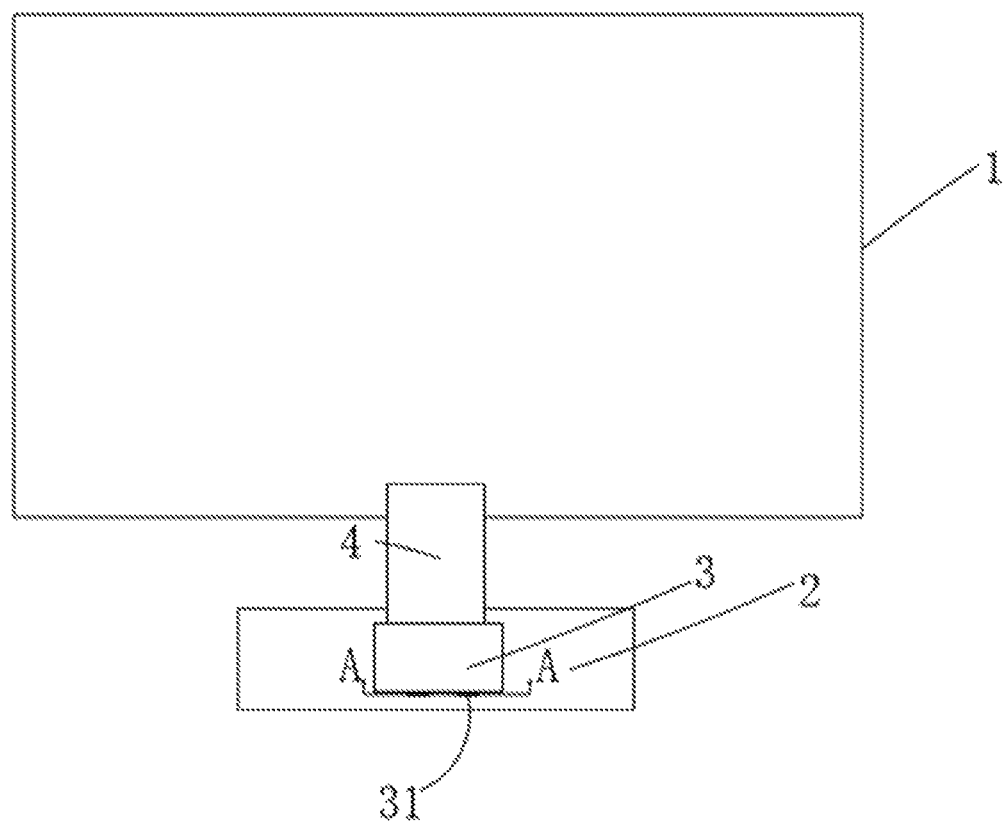
FIG. 2 is a schematic view showing a display device provided by the present disclosure.
Figure 3:
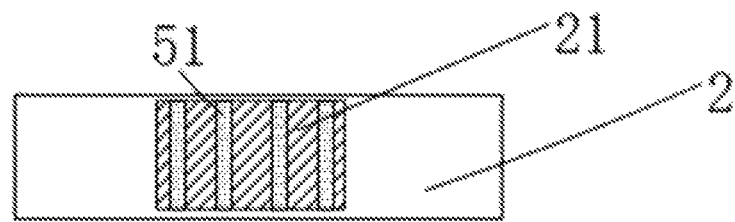
FIG. 3 is a schematic view showing a backside of a PCB of a display device provided by the present disclosure.

Referring to FIG. 2 and FIG. 3, the present disclosure provides a display device, including a display panel 1, a flexible circuit board (FCB) 4, a printed circuit board (PCB) 2, and a source driver chip 3. The PCB 2 is connected to the display panel 1 by the FCB 4.

The source driver chip 3 is bonded to a front side of the PCB 2, and an exposed copper area 21 is disposed on a backside of the PCB 2 corresponding to the source driver chip 3.

It should be noted that the PCB 2 provided by the present disclosure uses a chip on board (COB) technology that directly bonding the source driver chip 3 to the PCB 2 and forming the exposed copper area 21 on the backside of the PCB 2 corresponding to the source driver chip 3. Compared to a heat dissipation fin in a conventional chip on film (COF) technology, heat dissipation efficiency of the exposed copper area 21 in the COB technology is significantly increased, thereby ensuring heat dissipation effect of a chip and addressing an issue that temperatures of a chip are too high due to bad heat dissipation effect in a conventional technology.

Meanwhile, because heat is dissipated by the exposed copper area 21, there is no need adding additional heat dissipation fins; therefore, costs of the heat dissipation fins are saved. Moreover, because the source driver chip 3 is no longer disposed on the FCB 4, a size of the FCB 4 may be less than a size of an FCB in a conventional technology. As a result, costs of the FCB 4 may be further reduced.

Furthermore, both the source driver chip 3 and the PCB 2 have a rigid structure, and they are bonded to each other by a rigidity-to-rigidity bonding technology. On the other hand, the FCB 4 has a flexible structure and uses soft-to-soft bonding technology during its bonding process. Compared to the soft-to-soft bonding technology, the rigidity-to-rigidity bonding technology has advantages such as maturity, simple process, high yield, and high production efficiency.

Furthermore, as shown in FIG. 3, in some embodiments of the present disclosure, an area a horizontal projection of the source driver chip 3 on the PCB 2 is less than an area of the exposed copper area 21, that is, the exposed copper area 21 fully covers the source driver chip 3. A heat dissipation area is enlarged due to the big exposed copper area 21, thereby improving heat dissipation effect of the source driver chip 3 and better ensuring working stability of the source driver chip 3.

Figure 4:
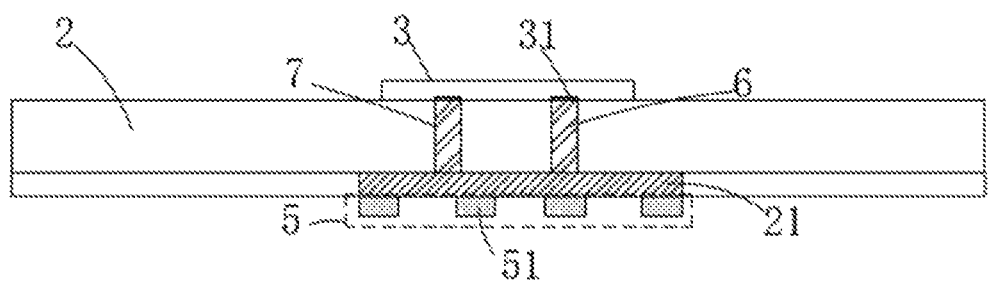
FIG. 4 is a sectional view taken along line A-A in FIG. 2.

Selectivity, as shown in FIG. 3 and FIG. 4, in some embodiments of the present disclosure, an auxiliary heat dissipation layer 5 is further disposed on a side of the exposed copper area 21 away from the source driver chip 3. A material of the auxiliary heat dissipation layer 5 has better thermal conductivity than that of copper. Therefore, by using the auxiliary heat dissipation layer 5, heat dissipation capability may be enhanced, heat concentration may be reduced, heat dissipation effect may be improved, working stability and reliability of the source driver chip 3 may be improved, and a lifetime of the source driver chip 3 may be extended.

Preferably, the material of the auxiliary heat dissipation layer 5 is graphene. Of course, the material of the auxiliary heat dissipation layer 5 may be other materials having better thermal conductivity than that of copper.

Specifically, as shown in FIG. 3 and FIG. 4, the auxiliary heat dissipation layer 5 includes a plurality of heat dissipation strips 51 spaced apart from each other. By disposing the dissipation layer 5 assembled by the plurality of heat dissipation strips 51 spaced apart from each other, heat may be distributed. Compared to a heat dissipation layer with a single layer, the heat dissipation layer with the plurality of heat dissipation strips 51 may improve uniformity of heat dissipation.

Furthermore, as shown in FIG. 3 and FIG. 4, in some embodiments of the present disclosure, the display device further includes at least one thermal conductor 6. Corresponding to the thermal conductor 6, at least one through hole 8 is defined in the PCB 2. One of the at least one thermal conductor 6 is disposed in each of the at least one through hole 7, an end of the at least one thermal conductor 6 is in contact with the exposed copper area 21, and the other end of the thermal conductor 6 is in contact with the source driver chip 3.

By disposing the thermal conductor 6, heat may be transferred between the source driver chip 3 and the exposed copper area 21, thereby increasing heat transfer efficiency and further improving heat dissipation effect.

Selectivity, a material of the thermal conductor 6 may be same as a conductive material of the PCB 2, that is, the material of the thermal conductor 6 is copper. Alternatively, the material of the thermal conductor 6 may be other materials that have better thermal conductivity than copper, such as graphene.

It should be noted, as shown in FIG. 2 and FIG. 4, the source driver chip 3 typically includes a plurality of pins. Specifically, not all of the pins receive input signals, and those pins that do not receive input signals are dummy pins 31. In some embodiments of the present disclosure, the source driver chip 3 includes at least one dummy pin 31. Each of the at least one dummy pin 31 is in contact with one of the at least one thermal conductor 6, thereby further increasing heat transfer efficiency and improving heat dissipation effect.

Selectivity, in some embodiments of the present disclosure, the at least one thermal conductor 6 fully fills the through hole 7 to ensure heat dissipation effect.

Specifically, the display panel 1 is an organic light emitting diode (OLED) display panel or a liquid crystal display (LCD) panel.

To sum up, the present disclosure provides a display device, including a display panel, an FCB, a PCB, and a source driver chip. The PCB is connected to the display panel by the FCB, the source driver chip is bonded to a front side of the PCB, and an exposed copper area is disposed on a backside of the PCB corresponding to the source driver chip. Therefore, heat dissipation effect of a chip is improved, production costs are reduced, and working stability of products is ensured.

In summary, many changes and modifications to the described embodiment can be carried out by those skilled in the art, and all such changes and modifications are intended to be included within the scope of the appended claims.

What is claimed is:

1. A display device, comprising:
   a display panel;
   a flexible circuit board (FCB);
   a printed circuit board (PCB); and
   a source driver chip;
   wherein the PCB is connected to the display panel by the FCB, the source driver chip is bonded to a front side of the PCB, an exposed copper area is disposed on a backside of the PCB corresponding to the source driver chip, and wherein an auxiliary heat dissipation layer is disposed on a side of the exposed copper area away from the source driver chip.

2. The display device of claim 1, wherein an area of a horizontal projection of the source driver chip on the PCB is less than an area of the exposed copper area.

3. The display device of claim 1, wherein a material of the heat dissipation layer is graphene.

4. The display device of claim 1, wherein the auxiliary heat dissipation layer comprises a plurality of heat dissipation strips spaced apart from each other.

5. The display device of claim 1, wherein the display device comprises at least one thermal conductor, at least one through hole is defined in the PCB, one of the at least one the thermal conductor is disposed in each of the at least one through hole, an end of the at least one thermal conductor is in contact with the exposed copper area, and the other side of the at least one thermal conductor is in contact with the source driver chip.

6. The display device of claim 5, wherein a material of the thermal conductor is copper.

7. The display device of claim 5, wherein a material of the thermal conductor is graphene.

8. The display device of claim 5, wherein the source driver chip comprises at least one dummy pin, and each of the at least one dummy pin is in contact with one of the at least one thermal conductor.

9. The display device of claim 5, wherein the thermal conductor fully fills the through hole.

* * * * *